(12) United States Patent
Shibata et al.

(10) Patent No.: US 9,192,074 B2
(45) Date of Patent: Nov. 17, 2015

(54) COOLING DEVICE FOR RACK-TYPE ELECTRONIC EQUIPMENT AND DATA CENTRE

(75) Inventors: Hiroshi Shibata, Aichi (JP); Mutsuhiko Matsumoto, Aichi (JP); Masafumi Matsui, Aichi (JP); Shigeyuki Hosono, Aichi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 284 days.

(21) Appl. No.: 13/983,772

(22) PCT Filed: Feb. 28, 2012

(86) PCT No.: PCT/JP2012/001341
§ 371 (c)(1),
(2), (4) Date: Aug. 6, 2013

(87) PCT Pub. No.: WO2012/120830
PCT Pub. Date: Sep. 13, 2012

(65) Prior Publication Data
US 2013/0314873 A1      Nov. 28, 2013

(30) Foreign Application Priority Data

Mar. 9, 2011   (JP) .................................. 2011-051220

(51) Int. Cl.
*H05K 7/20*  (2006.01)
*H01L 23/473*  (2006.01)
(52) U.S. Cl.
CPC ........ *H05K 7/20336* (2013.01); *H05K 7/20136* (2013.01); *H05K 7/20818* (2013.01); *H05K 7/20827* (2013.01)

(58) Field of Classification Search
CPC . G06F 1/181–1/182; H05K 7/20218–7/20381; H05K 7/20409–7/20418; H01L 23/367–23/3677; H01L 23/473; H01L 23/46–23/467
USPC ....................... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS 6,834,713 B2 * 12/2004 Ghosh ................ F28D 15/0266
165/104.21
7,096,928 B2    8/2006 Phillips et al.
(Continued)

FOREIGN PATENT DOCUMENTS

JP    57-195897 U    12/1982
JP    62-71299       4/1987
(Continued)

OTHER PUBLICATIONS

English Translation of Taiwanese Search Report issued on Apr. 22, 2014 for the related Taiwanese Patent Application No. 101107311.
(Continued)

*Primary Examiner* — Anthony Haughton
*Assistant Examiner* — Razmeen Gafur
(74) *Attorney, Agent, or Firm* — Panasonic Patent Center

(57) ABSTRACT

The present invention provides a cooling device for rack-type electronic equipment. The rack-type electronic equipment is provided with electronic circuit devices having different heating quantities inside an enclosure, and the cooling device has multiple heat pipes for cooling the rack-type electronic equipment. A condenser unit is provided on the upper surface of the enclosure, an evaporator is provided on the back surface of the enclosure, and each electronic circuit device having a different heating quantity is cooled by means of the heat pipes.

10 Claims, 10 Drawing Sheets

(56) References Cited

U.S. PATENT DOCUMENTS

| | | | |
|---|---|---|---|
| 7,660,109 B2* | 2/2010 | Iyengar | H05K 7/20754 165/104.33 |
| 7,679,909 B2* | 3/2010 | Spearing | E05D 11/00 165/80.4 |
| 7,963,118 B2* | 6/2011 | Porter | H05K 7/20827 361/696 |
| 8,184,435 B2* | 5/2012 | Bean, Jr. | H05K 7/20745 165/104.33 |
| 8,274,790 B2* | 9/2012 | Campbell | H05K 7/20781 165/104.33 |
| 8,488,323 B2* | 7/2013 | Peterson | G06F 1/20 165/104.33 |
| 9,007,221 B2* | 4/2015 | Zeighami | H05K 7/20781 165/80.4 |
| 2003/0010477 A1 | 1/2003 | Khrustalev et al. | |
| 2006/0000582 A1* | 1/2006 | Phillips | F28D 15/025 165/104.21 |
| 2007/0242438 A1* | 10/2007 | Belits | F28D 15/0266 361/700 |
| 2007/0297136 A1* | 12/2007 | Konshak | H05K 7/20781 361/699 |
| 2008/0204999 A1* | 8/2008 | Clidaras | H05K 7/20836 361/696 |
| 2008/0209931 A1* | 9/2008 | Stevens | H05K 7/20763 361/699 |
| 2009/0154096 A1* | 6/2009 | Iyengar | H05K 7/20754 361/694 |
| 2009/0259343 A1* | 10/2009 | Rasmussen | H05K 7/2079 700/282 |
| 2009/0268404 A1* | 10/2009 | Chu | H05K 7/20836 361/696 |
| 2010/0096105 A1* | 4/2010 | Novotny | H05K 7/20736 165/80.2 |
| 2010/0290190 A1* | 11/2010 | Chester | H05K 7/20772 361/701 |
| 2011/0026225 A1* | 2/2011 | Ostwald | H05K 7/20736 361/699 |
| 2011/0063792 A1* | 3/2011 | Schmidt | G06F 1/20 361/679.46 |
| 2011/0063798 A1* | 3/2011 | Denter | H05K 7/20681 361/695 |
| 2011/0232889 A1* | 9/2011 | Eckberg | F28D 1/0435 165/200 |
| 2011/0315353 A1* | 12/2011 | Campbell | H05K 7/20809 165/104.31 |
| 2012/0120603 A1* | 5/2012 | Campbell | H05K 7/20836 361/698 |
| 2012/0140404 A1* | 6/2012 | Peterson | G06F 1/20 361/679.47 |

FOREIGN PATENT DOCUMENTS

| | | |
|---|---|---|
| JP | 04-097396 U | 8/1992 |
| JP | 2009-135287 | 6/2009 |
| TW | 200952617 | 12/2009 |

OTHER PUBLICATIONS

International Search Report of PCT Application No. PCT/JP2012/001341 dated Apr. 3, 2012.

* cited by examiner

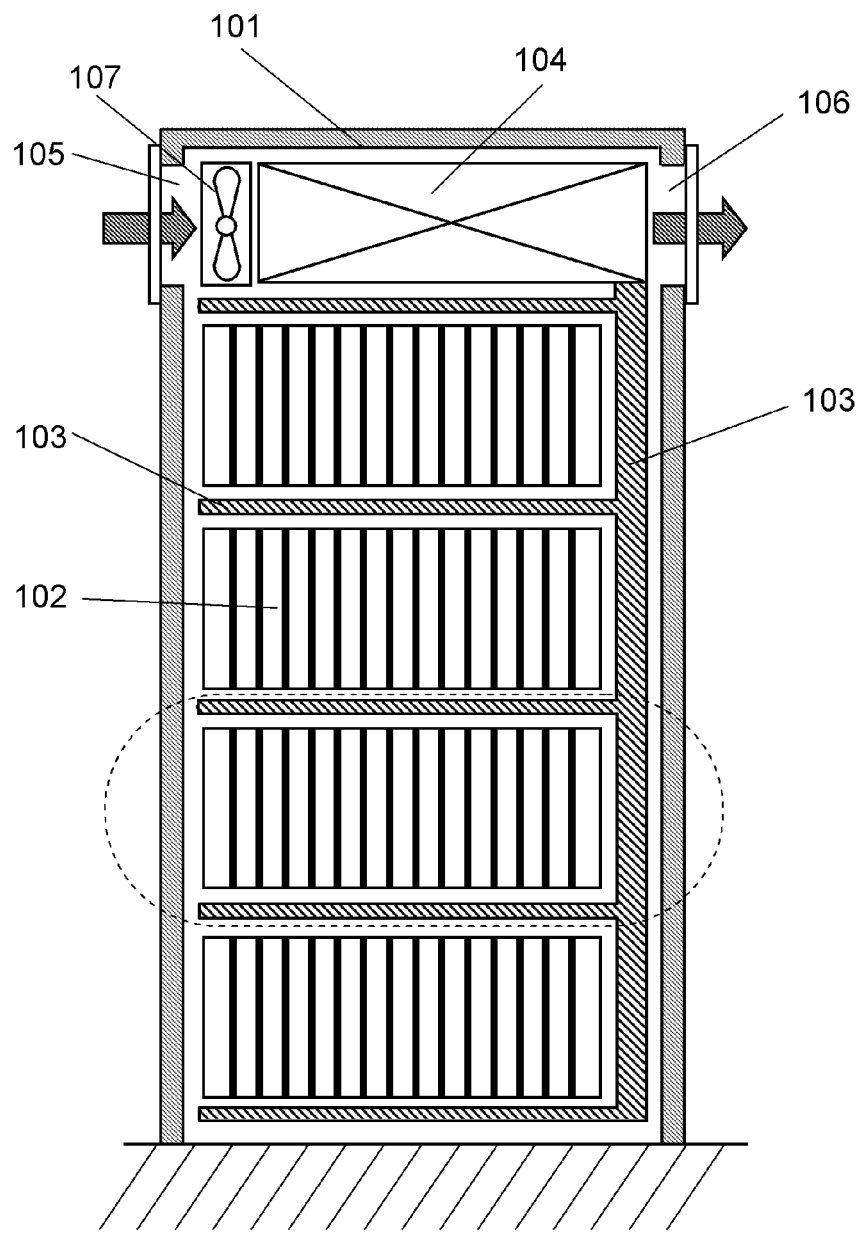

COOLING DEVICE FOR RACK-TYPE ELECTRONIC EQUIPMENT AND DATA CENTRE

TECHNICAL FIELD

The prevent invention relates to a cooling device for rack-type electronic equipment such as electronic computers housed in a rack-type enclosure and a data centre.

BACKGROUND ART

Due to recent increases in high performance of electronic components and density growth thereof on a control board, there is significantly increased heat generation from the control board. Also due to recent increases in downsized, densely integration in electronic components and an amount of information to be processed, various cooling methods have been invented, e.g. to effectively cool electronic components close to heated areas and to cool respective racks. (for example, PTL 1)

A conventional cooling device for rack-type electronic equipment is described hereinafter with reference to FIG. 10. As shown in FIG. 10, the conventional rack-type electronic equipment comprises a group of circuit boards 102 including electronic circuits thereon inside enclosure 101 and a cooling device including heat pipe 103 and heat exchanger 104. The group of circuit boards 102 is orderly arranged into a rack shape inside enclosure 101. Heat pipe 103 is disposed to fill a gap between each one of the groups of circuit boards 102. Heat exchanger 104 is disposed on a top of enclosure 101 and heat pipe 103 is connected to heat exchanger 104. Inlet 105 and outlet 106 are disposed at the top of enclosure 101. Air blower 107 disposed close to inlet 105 is activated to pass outdoor air through enclosure 101. An air sucked from inlet 105 is discharged from outlet 106 through heat exchanger 104.

Heat generated from the group of circuit boards 102 warms ambient air. The high-temperature air is cooled by heat exchange with refrigerant in heat pipe 103. Vaporized refrigerant by heat absorption travels upward through heat pipe 103 and moves into heat exchanger 104. The vaporized refrigerant is condensed to liquid by heat exchange with cold outdoor air sucked by air blower 107 in heat exchanger 104 and goes down through heat pipe 103.

The conventional cooling device needs to be designed as an integrated cooling device comprising enclosure 101 and the group of circuit boards 102 because heat pipe 103 is disposed to fill the gap between each one of the group of circuit boards 102. For that reason, heat pipe 103 needs to be designed in response to size and quantity of the group of circuit boards 102.

In the cooling device shown in FIG. 10, since heat pipe 103 forms a cooling cycle for the whole cooling device, it is difficult for the conventional cooling device to deal with different heat quantities generated from each one of the groups of circuit boards 102.

CITATION LISTS

Patent Literatures

PTL1: Unexamined Japanese Patent Application Publication No. 62-71299.

SUMMARY OF THE INVENTION

The present invention relates to a cooling device for rack-type electronic equipment comprising electronic circuit devices having different heating quantities inside an enclosure for cooling the rack-type electronic equipment by multiple heat pipes formed of an evaporator section and a condenser section. A condenser and an evaporator are connected with a drainage tube and a steam tube. Liquid refrigerant in the evaporator is vaporized by heat generated from the electronic circuit devices and the vaporized refrigerant in the condenser is liquefied by air sucked from outside of the enclosure. The electronic circuit devices having different heating quantities are cooled respectively by the respective heat pipes.

Heat generated from the electronic circuit devices is thus cooled respectively regardless of a layout of the electronic circuit devices.

BRIEF DESCRIPTION OF DRAWINGS

FIG. 10 illustrates a conventional cooling device for rack-type electronic equipment.

DESCRIPTION OF EMBODIMENTS

An embodiment of the present invention is demonstrated hereinafter with reference to the accompanying drawings.

Embodiment

Figure 1:
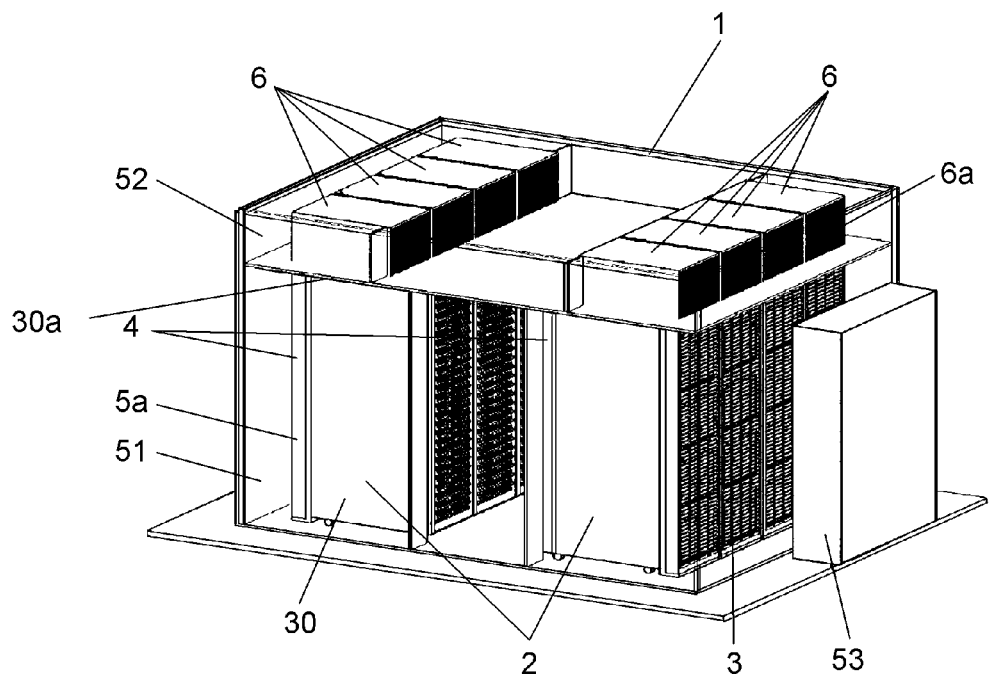
FIG. 1 is a schematic view of a data centre comprising a cooling device for rack-type electronic equipment in accordance with an embodiment of the present invention.

FIG. 1 shows a schematic view of a data centre comprising a cooling device for rack-type electronic equipment in accordance with an embodiment of the present invention. As shown in FIG. 1, multiple rack-type electronic equipment 2 is disposed in data centre 1. Rack-type electronic equipment 2 has enclosure 30 with openings both on a front side and a back side respectively. Multiple electronic circuit devices 3 are disposed into a rack shape in enclosure 30. An operating panel and a display part (not shown) are disposed into a front side of rack-type electronic equipment 2. Wirings and power cables for connecting electronic circuit devices 3 to their counterparts or external devices (not shown) are disposed in a back side of rack-type electronic equipment 2. Not all electronic circuit devices 3 have the operating panel and the display part. Multiple rack-type electronic equipment 2 is disposed in data centre 1, generally called as a computer room or a server room.

Figure 2:
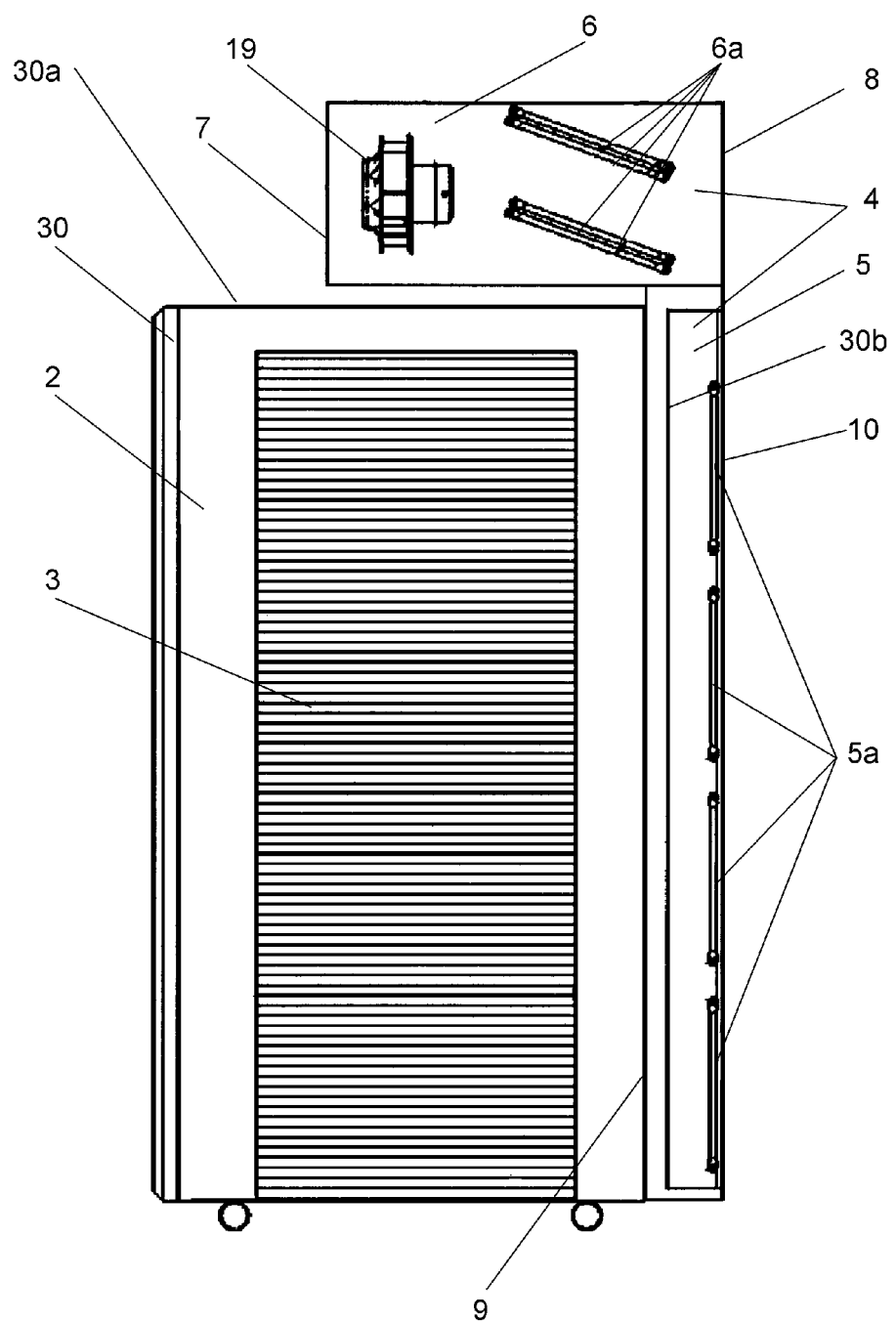
FIG. 2 is a side view of the cooling device for rack-type electronic equipment in accordance with an embodiment of the present invention.

FIG. 2 is a side view of the cooling device for rack-type electronic equipment in accordance with the embodiment of the present invention. As shown in FIG. 2, cooling device 4 comprises evaporator section 5 disposed covering back side 30b of enclosure 30 and condenser section 6 disposed on top plate 30a of enclosure 30. Multiple plate-like evaporators 5a are disposed in evaporator section 5. Multiple plate-like condensers 6a and air blower 19 are embedded in condenser section 6. Both condenser section 6 and evaporator section 5 have openings for allowing air to pass through back and forth. That is, outdoor air inlet 7 and outdoor air outlet 8 are disposed in condenser section 6. Exhaust air inlet 9 and exhaust air outlet 10 are disposed in evaporator section 5.

Figure 3:
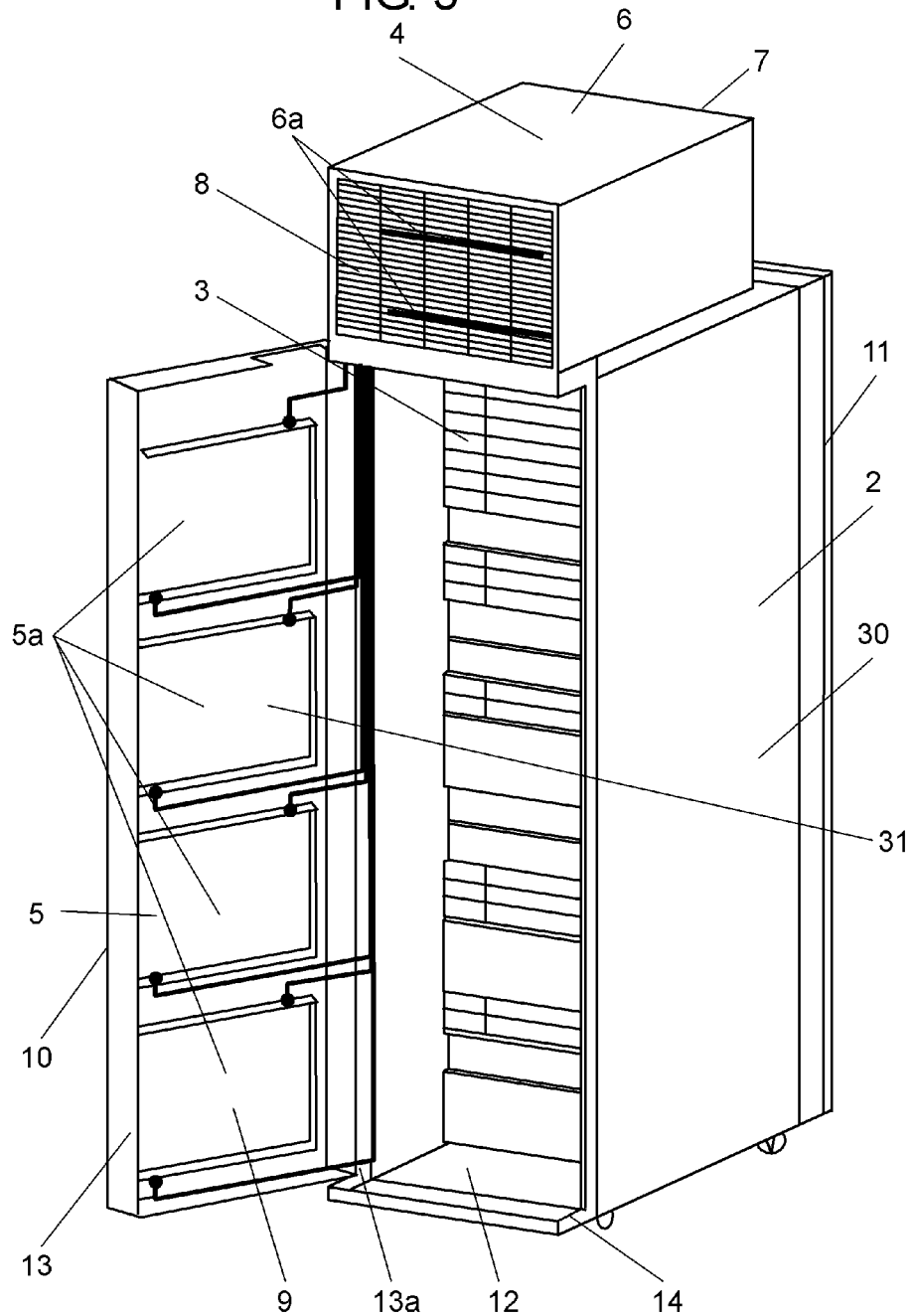
FIG. 3 is a perspective view of the cooling device with a door opened in accordance with an embodiment of the present invention.

FIG. 3 is a perspective view of the cooling device for rack-type electronic equipment with a door opened in the embodiment of the present invention. As shown in FIG. 3, evaporator section 5 is disposed to serve as a single swing door mounted on rotary shaft 13a. Rack-type electronic equipment 2, as described previously, has the openings on the front and the back sides respectively for the air to pass through. Air inlet 11 is the opening of the front side. Air outlet 12 is the opening of the back side. Air inlet 11 and air outlet 12 can pass the air therethrough. Air inlet 11 can form, e.g. a punched hole, lattice or net. In FIG. 3, when evaporator section 5 serving as the door is open, almost an entire back side serves as an opening. Multiple electronic circuit devices 3 are disposed in parallel with a ceiling surface (or a floor surface) in enclosure 30. Electronic circuit devices 3 can be disposed in parallel with side surfaces. When cooling an inside of rack-type electronic equipment 2, air is sucked from air inlet 11. After the air takes heat generated from electronic circuit devices 3 during passing therethrough disposed in parallel with the ceiling surface (or the side surfaces) and is discharged from air outlet 12.

Next, evaporator section 5 is demonstrated hereinafter. Evaporator section 5 comprises door section 13 and frame section 14 within an entire frame. The entire frame comprises a peripheral frame and a lattice panel section for allowing air to pass through from the front side to the back side. Plate-like evaporators 5a are disposed in parallel with the panel section in door section 13. Frame section 14 supports door section 13. Since the panel section can only pass the air therethrough like air inlet 14, it can form, e.g. a punched hole or net. Evaporators 5a are disposed in entire evaporator section 5 so that the air passing through inside enclosure 30 of rack-type electronic equipment 2 can be cooled. Four sheets of evaporators 5a are longitudinally disposed in accordance with the embodiment of the present invention.

Figure 4:
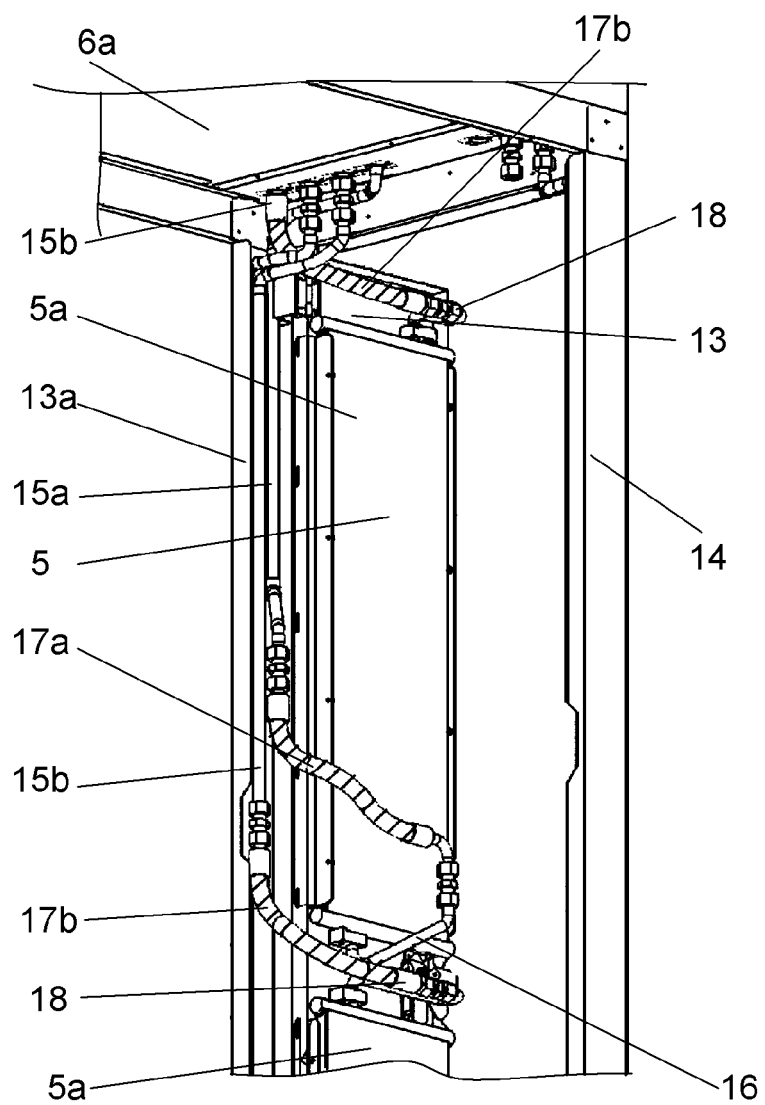
FIG. 4 shows a piping connection of an evaporator inside a door of the cooling device for rack-type electronic equipment in accordance with an embodiment of the present invention.

FIG. 4 illustrates a piping connection of the evaporator inside the door of the cooling device for rack-type electronic equipment in accordance with the embodiment of the present invention. As shown in FIG. 4, drainage pipe 15a and steam tube 15b connecting evaporator 5a and condenser 6a are longitudinally disposed along with an internal surface of frame section 14. An end of drainage tube 15a is disposed around at a lower part of evaporator 5a. Connecting port of drainage tube 16 disposed around at the lower part of evaporator 5a and the end of drainage tube 15a are connected with flexible rubber hose 17a. An end of steam tube 15b is disposed above an upper part of evaporator 5a. The end of steam tube 15b and connecting port of steam tube 18 disposed at the upper part of evaporator 5a are connected with rubber hose 17b.

Inside of rubber hose 17a and rubber hose 17b is preferred to be of IIR (Isobutylene-Isoprene Rubber) or to be coated with nylon resin such as refrigerant hoses. Rubber hose 17a and rubber hose 17b are disposed to be approximately horizontal direction near rotary shaft 13a of door section 13 (approximately orthogonal direction to rotary shaft 13a). In this manner, evaporator 5a and steam tube 15b are connected with rubber hose 17a and rubber hose 17b which are flexible tubes and orthogonal to rotary shaft 13a.

An elbow can be used for each connection between the both ends of rubber hose 17a and rubber hose 17b (connections between drainage tube 15a and rubber hose 17a and between evaporator 5a and rubber hose 17a, and connections between steam tube 15b and rubber hose 17b and between evaporator 5a and rubber hose 17b) or rubber hose 17a and rubber hose 17b themselves can be bent. Rubber hose 17a and rubber hose 17b are used in accordance with the embodiment of the present invention, but a type of flexible tube other than rubber can be used. For example, the flexible tube such as a metallic flexible hose can be also used.

Next, condenser section 6 is demonstrated hereinafter. As shown in FIG. 2, condenser section 6 comprises condenser 6a and air blower 19 in a box enclosure of the condenser section. Outdoor air inlet 7 and outdoor air outlet 8 which are the openings for allowing air to pass through are formed face to face in the box enclosure for the condenser section. Outdoor air inlet 7 and outdoor air outlet 8 can pass the air therethrough as other vent holes do, so that outdoor air inlet 7 and outdoor air outlet 8 can form, e.g. a punched hole, lattice or net. Condenser 6a is disposed so that air generated from air blower 19 can hit against and then pass through condenser 6a. In FIG. 2, condenser 6a is disposed diagonally to a ventilation direction. Condenser 6a has as many quantities as evaporator 5a. A thermo-siphon heat pipe is formed by connecting a sheet of evaporator 5a and a sheet of condenser 6a with drainage tube 15a and steam tube 15b shown in FIG. 4.

As shown in FIG. 1, multiple rack-type electronic equipment 2 is disposed in the data centre 1. As shown in FIG. 2, cooling device 4 is mounted hanging on rack-type electronic equipment 2. That is, condenser section 6 is disposed on top plate 30a of enclosure 30. Evaporator section 5 is disposed on back side 30b of enclosure 30.

As shown in FIG. 1, data centre 1 is separated into main unit space 51 at a lower section and ventilation space 52 at an upper section with top plate 30a between them. Rack-type electronic equipment 2 is disposed in main unit space 51. Rack-type electronic equipment 2 has cooling device 4 respectively. Condenser 6a is disposed in ventilation space 52. Main unit space 51 has an air conditioner 53 for controlling temperature of the inside.

A method of processing heat generated from rack-type electronic equipment 2 in the configuration described above is demonstrated hereinafter. Refrigerant in condenser 6a of condenser section 6 is cooled and condensed to liquid by outdoor air in ventilation space 52. Liquefied refrigerant goes down evaporator 5a. While the heat generated from rack-type electronic equipment 2 is discharged to main unit space 51 by an exhaust air blower (not shown) disposed in rack-type electronic equipment 2. At this time, high-temperature exhaust air passes through evaporator section 5, and is cooled by heat exchange that is done by vaporizing the refrigerant in evaporator 5a. On top of that, temperature of main unit space 51 is entirely controlled by air conditioner 53.

An amount of heat discharged from rack-type electronic equipment 2 to main unit space 51 is thus reduced by cooling device 4, so that a load of air conditioner 53 is reduced. The integrated data centre capable of temperature control that uses less energy is achievable by an efficient use of outdoor air. As shown in FIG. 2, since cooling device 4 is disposed for each of rack-type electronic equipment 2, air blower 19 controls air volume for each cooling device 4. An appropriate cooling can be done in response to the amount of heat generated from rack-type electronic equipment 2.

As described previously, the wirings and the power cables for connecting electronic circuit devices 3 to their counterparts or to the external devices are disposed in back side 30b of rack-type electronic equipment 2. As shown in FIG. 4, rubber hose 17a and rubber hose 17b are used to connect evaporator 5a and condenser 6a, thus evaporator 5a can serve as the door. The wiring work at the installation or maintenance can be done with ease. Rubber hose 17a and rubber hose 17b are disposed orthogonal to rotary shaft 13 of evaporator section 5, so that they can not be twisted, and this structure allows opening and closing with smaller force.

As shown in FIG. 3, multiple electronic circuit devices 3 having different heating quantities are housed in rack-type electronic equipment 2. However the presence of multiple heat pipes 31 in cooling device 4 enables the cooling device to cool electronic circuit devices 3 having different heating quantities.

Figure 5:
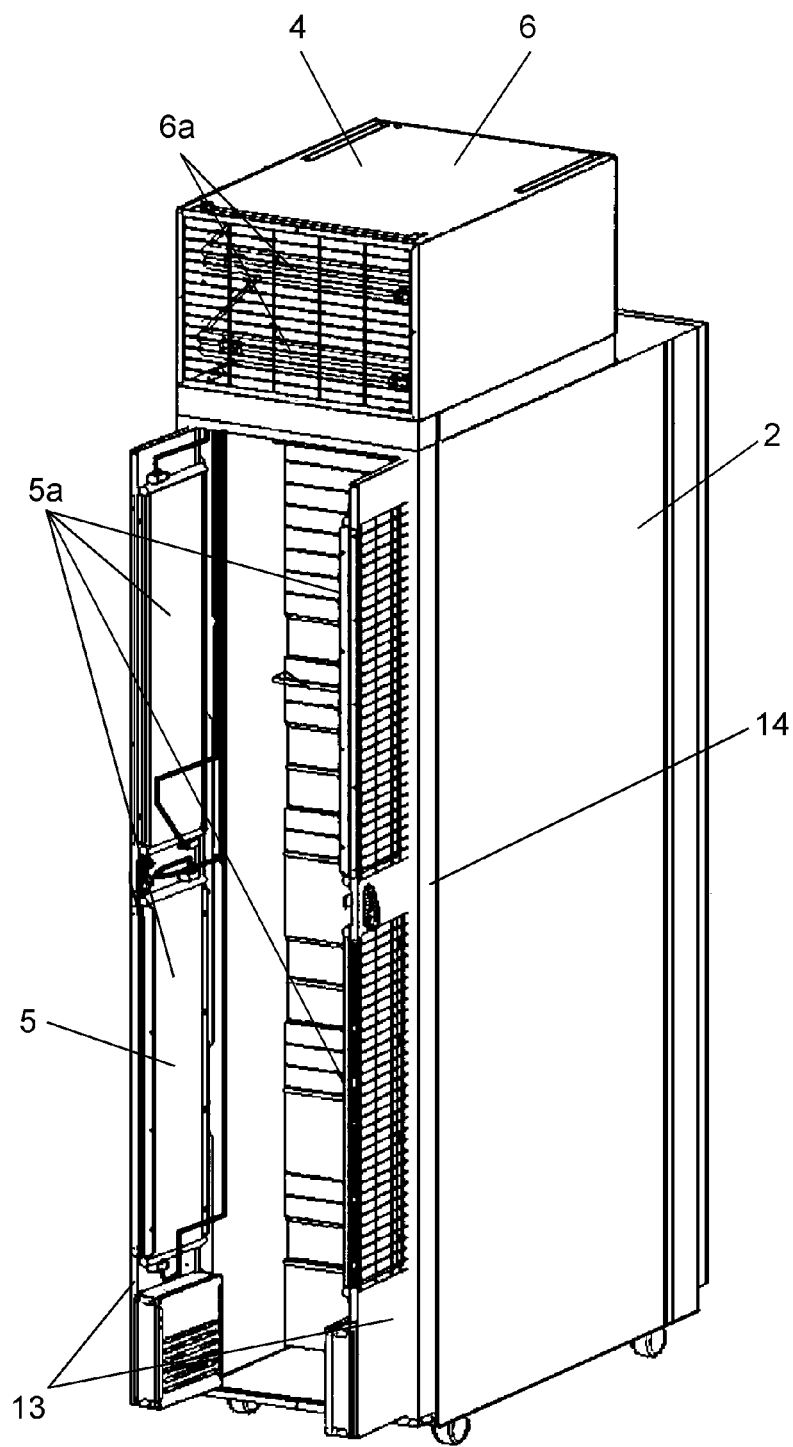
FIG. 5 is a schematic perspective view of the cooling device for rack-type electronic equipment having a double door opening from a center in accordance with an embodiment of the present invention.

FIG. 5 is a schematic perspective view of the cooling device for the rack-type electronic equipment having the double door opening from the center in accordance with the embodiment of the present invention. Evaporator section 5 can form not only the single door as shown in FIG. 3 but also the double door as shown in FIG. 5. In the case of the double door, a necessary space for the back side of rack-type electronic equipment 2 can be reduced.

Figure 6:
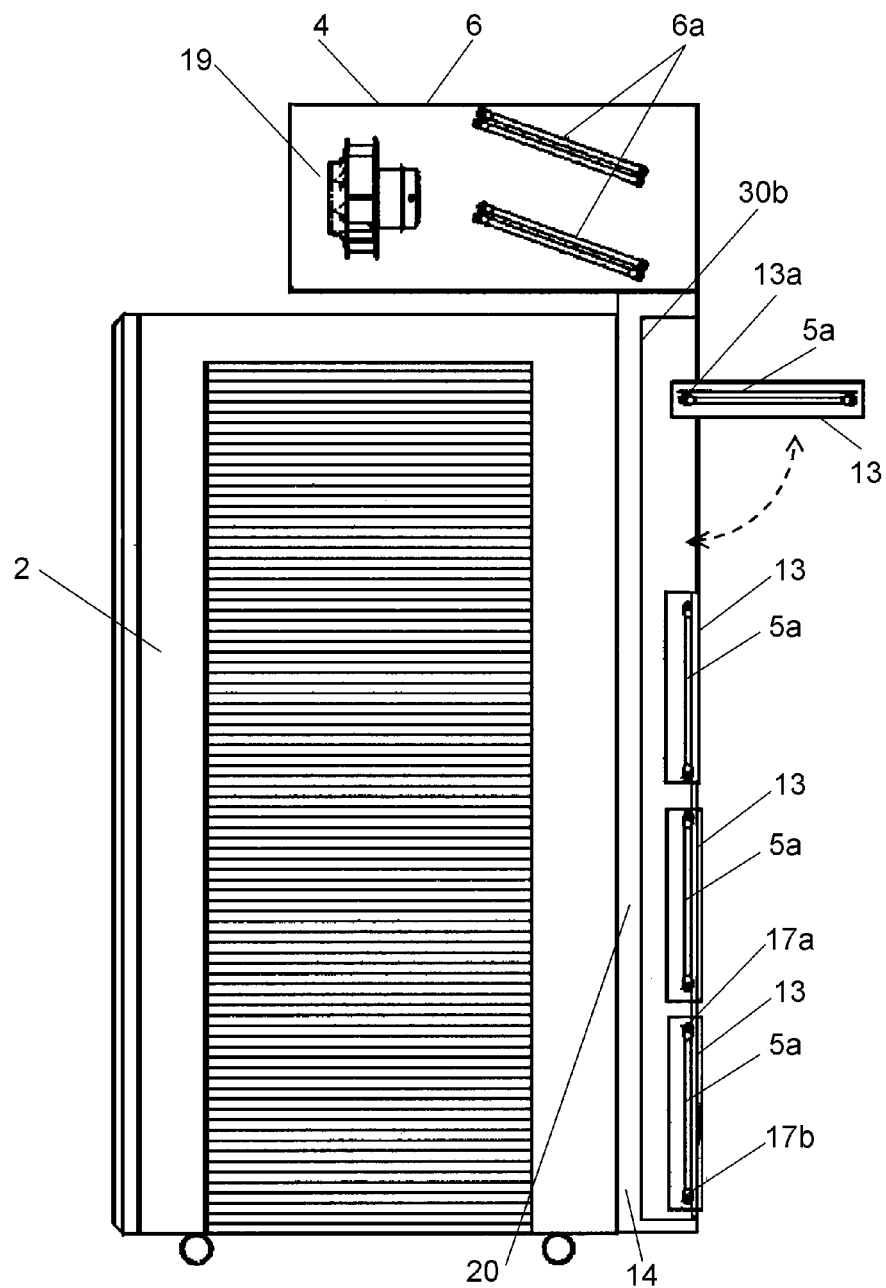
FIG. 6 is a schematic perspective view of the cooling device for rack-type electronic equipment having a flap-type door in accordance with an embodiment of the present invention.

FIG. 6 is a schematic perspective view of the cooling device for the rack-type electronic equipment having the flap-type door in accordance with the embodiment of the present invention. As shown in FIG. 6, evaporator section 5 can form the flap-type door. In this case, since rotary shaft 13a is disposed in a horizontal direction, directions of rubber hose 17a and rubber hose 17b connected to evaporator 5a disposed close to rotary shaft 13a are approximately vertical to rotary shaft 13a. Also in FIG. 6, the necessary space for back side 30b can be reduced by designing the door to close or open for each of evaporator 5a.

Control box 20 having an electric circuit for controlling the operation of air blower 19 is needed for cooling device 4. A control device in control box 20 detects a temperature of an outlet side of evaporator 5a for controlling air volume of air blower 19.

Figure 7:
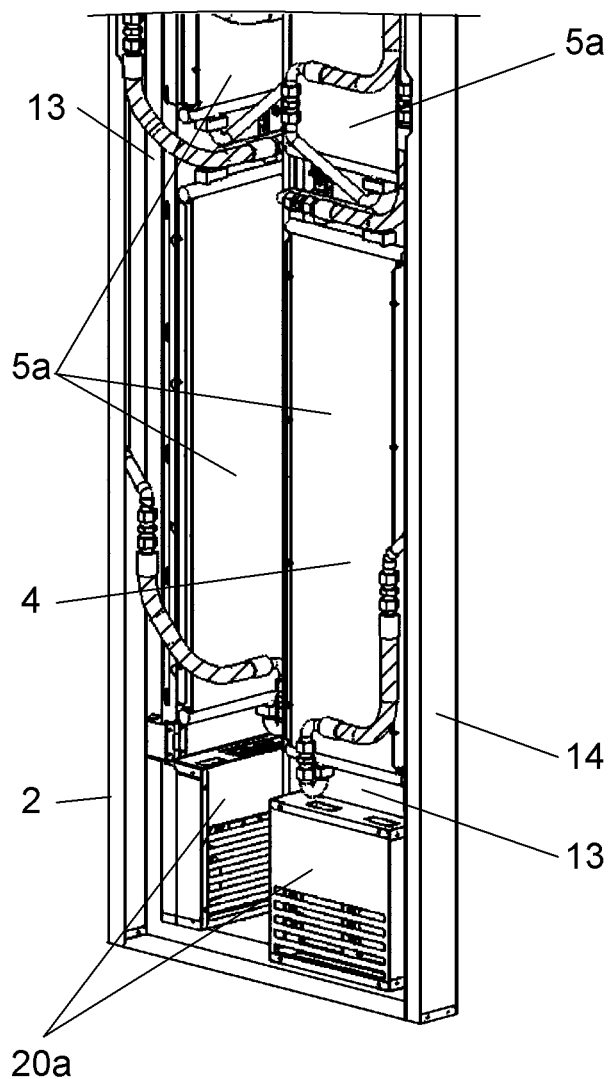
FIG. 7 is an arrangement plan of a control box of the cooling device for rack-type electronic equipment in accordance with an embodiment of the present invention.

FIG. 7 is an arrangement plan of the control box of the cooling device for rack-type electronic equipment in accordance with the embodiment of the present invention. As shown in FIG. 7, control box 20a is disposed at a lower part of door section 13.

Figure 8:
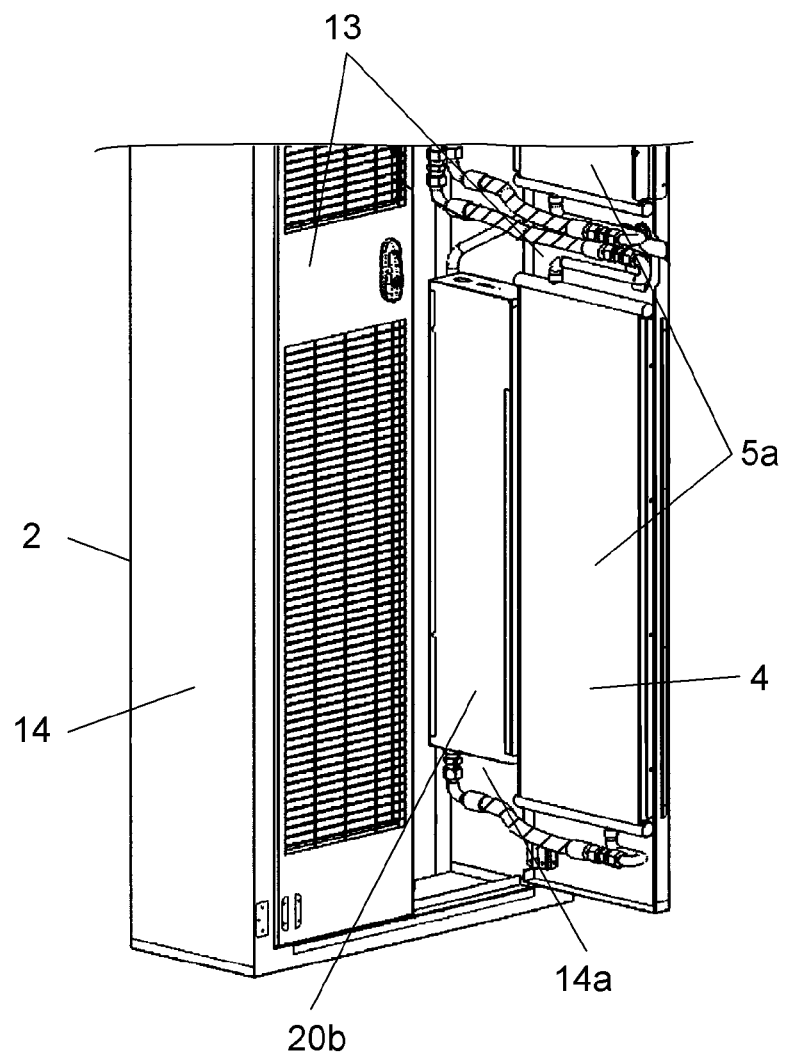
FIG. 8 is a different arrangement plan of the control box of the cooling device for rack-type electronic equipment in accordance with an embodiment of the present invention.

FIG. 8 is a different arrangement plan of the control box of the cooling device for rack-type electronic equipment in accordance with the embodiment of the present invention. As shown in FIG. 8, control box 20b can be disposed in inside wall 14a of frame section 14.

Figure 9:
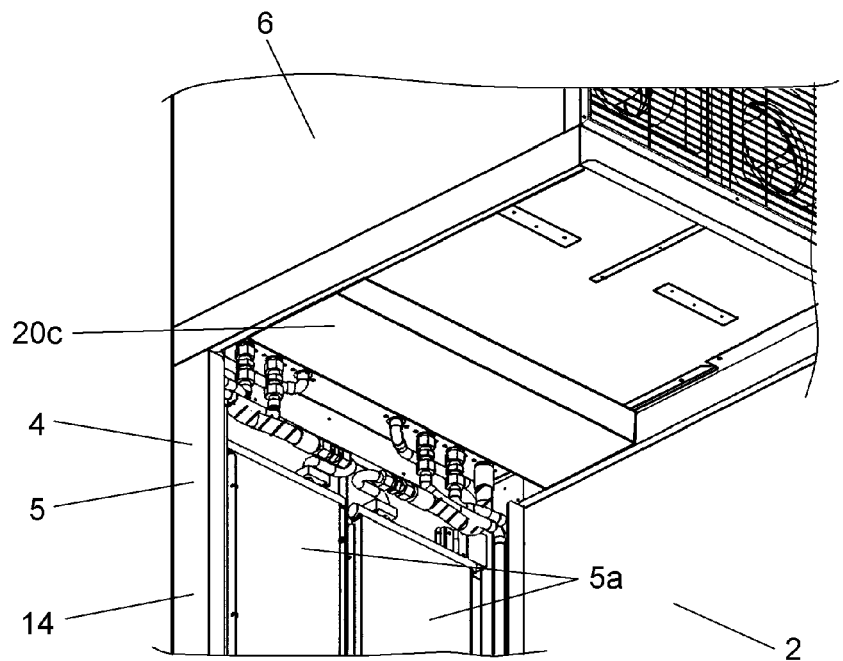
FIG. 9 is a further different arrangement plan of the control box of the cooling device for rack-type electronic equipment in accordance with an embodiment of the present invention.

FIG. 9 is a further different arrangement plan of the control box of the cooling device for rack-type electronic equipment in accordance with the embodiment of the present invention. As shown in FIG. 9, control box 20c can be disposed between condenser section 6 and evaporator section 5. Since control boxes, 20a, 20b and 20c are placed at a dead space of cooling device 4 or rack-type electronic equipment 2, the space can be used more efficiently. Control boxes, 20a, 20b and 20c, are disposed respectively in the side of cooling device 4, so that no adverse affect is given to a shape of rack-type electronic equipment 2, and the cooling device can be added to the rack with ease.

INDUSTRIAL APPLICABILITY

The cooling device for the rack-type electronic equipment in accordance with the embodiment of the present prevention can be used for cooling an enclosed device that includes heating elements such as electronic circuit devices.

REFERENCE MARKS IN THE DRAWINGS 1 data centre
2 rack-type electronic equipment
3 electronic circuit device
4 cooling device
5 evaporator section
5a evaporator
6 condenser section
6a condenser
7 outdoor air inlet
8 outdoor air outlet
9 exhaust air inlet
10 exhaust air outlet
11 air inlet
12 air outlet
13 door section
13a rotary shaft
14 frame section
14a inside wall
15a drainage tube
15b steam tube
16 connecting port of drainage tube
17a, 17b rubber hose
18 connecting port of steam tube
19 air blower
20, 20a, 20b, 20c control box
30 enclosure
30a top plate
30b back side
31 heat pipe
51 main unit space
52 ventilation space
53 air conditioner

The invention claimed is:

1. A cooling device for rack-type electronic equipment with electronic circuit devices having different heating quantities inside an enclosure for cooling said rack-type electronic equipment by heat pipes formed of an evaporator section and a condenser section, said cooling device comprising:
   said heat pipes;
   said condenser section having a condenser and an air blower therein and placed on a top plate of said enclosure; and
   said evaporator section having an evaporator therein and placed on a back face of said enclosure,
   wherein:
      said condenser and said evaporator are connected with a drainage tube and a steam tube,
      liquid refrigerant in said evaporator is vaporized by heat generated from said electronic circuit devices,
      said vaporized refrigerant in said condenser is liquefied by air sucked from outside of said enclosure, said electronic circuit devices having different heating quantities are cooled respectively by said respective heat pipes, and said evaporator section opens and closes as a door on a rotary shaft.

2. The cooling device for rack-type electronic equipment according to claim 1, wherein said evaporator section opens only in one direction as the door.

3. The cooling device for rack-type electronic equipment according to claim 1, wherein said evaporator section opens and closes as a double door opening from a center.

4. The cooling device for rack-type electronic equipment according to claim 1, wherein said evaporator section opens and closes as a flap-type door.

5. The cooling device for rack-type electronic equipment according to claim 1, wherein said evaporator and said steam tube are connected with a flexible tube orthogonal to said rotary shaft.

6. The cooling device for rack-type electronic equipment according to claim of 1, wherein the control box for controlling operation of said air blower is disposed between said evaporator section and said condenser section.

7. A data center comprising said multiple rack-type electronic equipment as defined in claim 1, wherein:

said data center is separated into a ventilation space above said top plate and a main unit space below said top plate, said multiple rack-type electronic equipment is disposed in said main unit space, the cooling device for rack-type electronic equipment according to claim 1 is disposed for each one of said electronic circuit devices having different heating quantities and said condenser is disposed in said ventilation space.

8. A cooling device for rack-type electronic equipment with electronic circuit devices having different heating quantities inside an enclosure for cooling said rack-type electronic equipment by heat pipes formed of an evaporator section and a condenser section, said cooling device comprising:

said heat pipes;

said condenser section having a condenser and an air blower therein and placed on a top plate of said enclosure; and said evaporator section having an evaporator therein and placed on a back face of said enclosure, wherein:

said condenser and said evaporator are connected with a drainage tube and a steam tube, liquid refrigerant in said evaporator is vaporized by heat generated from said electronic circuit devices, said vaporized refrigerant in said condenser is liquefied by air sucked from outside of said enclosure, said electronic circuit devices having different heating quantities are cooled respectively by said respective heat pipes, and said evaporator section has a door section where said evaporator can be disposed and a control box for controlling operation of said air blower is disposed in a lower part of said door section.

9. The cooling device for rack-type electronic equipment according to claim 8, wherein said evaporator section has a frame section pivotally supporting said door section and said control box is disposed in an inside wall of said frame section.

10. A cooling device for rack-type electronic equipment with electronic circuit devices having different heating quantities inside an enclosure for cooling said rack-type electronic equipment by heat pipes formed of an evaporator section and a condenser section, said cooling device comprising:

said heat pipes;

said condenser section having a condenser and an air blower therein and placed on a top plate of said enclosure; and said evaporator section having an evaporator therein and placed on a back face of said enclosure, wherein:

said condenser and said evaporator are connected with a drainage tube and a steam tube, said evaporator is configured so that liquid refrigerant in said evaporator can be vaporized by heat generated from said electronic circuit devices, said condenser is configured so that vaporized refrigerant in said condenser is liquefied by air sucked from outside of said enclosure, said heat pipes configured to cool said electronic circuit devices having different heating quantities respectively, and said evaporator section opens and closes as a door on a rotary shaft.

* * * * *